US012724073B2

(12) United States Patent
Bonetti et al.

(10) Patent No.: US 12,724,073 B2
(45) Date of Patent: Sep. 1, 2026

(54) METHOD AND DEVICE FOR TESTING PROTECTION RELAYS

(71) Applicant: MEGGER SWEDEN AB, Danderyd (SE)

(72) Inventors: Andrea Bonetti, Västerås (SE); Stefan Larsson, Sollentuna (SE); Peter Werelius, Solna (SE); Lennart Schottenius, Skarpnäck (SE); Gustav Östberg, Knivsta (SE)

(73) Assignee: MEGGER SWEDEN AB, Danderyd (SE)

( * ) Notice: Subject to any disclaimer, the term of this patent is extended or adjusted under 35 U.S.C. 154(b) by 205 days.

(21) Appl. No.: 18/669,638

(22) Filed: May 21, 2024

(65) Prior Publication Data

US 2024/0393397 A1 Nov. 28, 2024

(30) Foreign Application Priority Data

May 23, 2023 (SE) .................................. 2350615-7

(51) Int. Cl.
*G01R 31/327* (2006.01)

(52) U.S. Cl.
CPC ............................... *G01R 31/3278* (2013.01)

(58) Field of Classification Search
CPC ................................................ G01R 31/3278
See application file for complete search history.

(56) References Cited

U.S. PATENT DOCUMENTS 3,696,296 A * 10/1972 Nylen .................. H01R 29/00 324/755.11
5,742,513 A * 4/1998 Bouhenguel ....... G01R 31/3278 702/123
12,394,973 B2 * 8/2025 Sheth .................. H02H 1/0053
2006/0170432 A1 * 8/2006 Adolfsson ............. G01R 15/16 324/658
2012/0153931 A1 * 6/2012 Liu ........................ G01R 15/18 323/358
2015/0311788 A1 * 10/2015 Nandi ................ H02M 1/4225 323/282
2018/0328992 A1 11/2018 Stenner et al.
2018/0350556 A1 12/2018 Bleiner et al.
2020/0021100 A1 * 1/2020 Kwon ............... G01R 31/3278
2023/0213582 A1 * 7/2023 Buescher ................ G08B 5/36 340/644
2025/0102576 A1 * 3/2025 Juge .................. G01R 31/3277

FOREIGN PATENT DOCUMENTS

EP 2887482 A1 6/2015

OTHER PUBLICATIONS

Office Action in corresponding/related Swedish Application No. 2350615-7 dated Nov. 28, 2023.

* cited by examiner

*Primary Examiner* — Giovanni Astacio-Oquendo
(74) *Attorney, Agent, or Firm* — PATENT PORTFOLIO BUILDERS PLLC

(57) ABSTRACT

An analog accessory for use in a system for testing protection relays is provided, comprising inputs connectable to the current outputs of a test-set for protection relays and voltage outputs connectable to a protection relay to be tested. By providing an electric circuit adapted to convert current provided by the test-set into a voltage signal on the voltage outputs that simulates an output of a Rogowski sensor, A system and a method for testing protection relays are also provided.

17 Claims, 4 Drawing Sheets

I
Np:Ns
+
-
LMAG
Low Pass Filter 24
VOUT
+
-
22
20

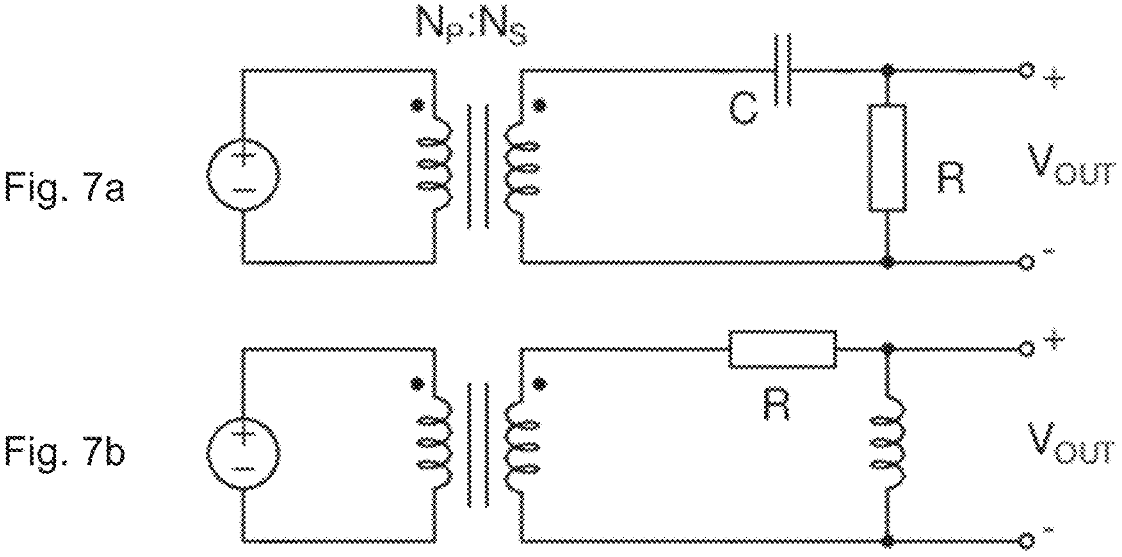
Np:Ns
C
R
VOUT
+
-
Fig. 7a
R
VOUT
+
-
Fig. 7b
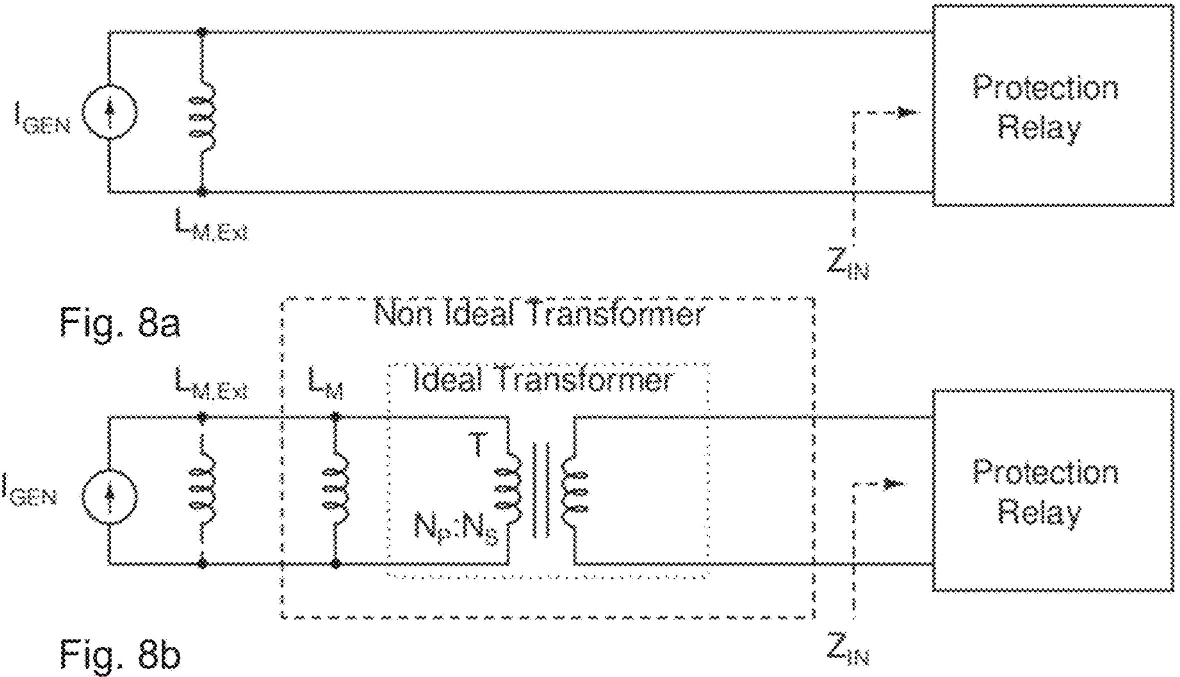
IGEN
LM,Ext
Protection Relay
ZIN
Fig. 8a
Non Ideal Transformer
Ideal Transformer
LM,Ext
LM
T
Np:Ns
IGEN
Protection Relay
ZIN
Fig. 8b

METHOD AND DEVICE FOR TESTING PROTECTION RELAYS

TECHNICAL FIELD

The present invention relates generally to testing of protection relays and more particularly to a system, an analog accessory and method for testing protection relays.

BACKGROUND ART

Protection systems in medium and high voltage power systems comprising protection relays make use of voltage transformers (VTs) and current transformers (CTs) that measure the primary quantities, such as voltages and currents, in the relevant phases and convert them into secondary quantities that have a range more accessible for the protection relay that measures them. Rated secondary voltages are typically of the order of 60 V, typically 57.7, 63.5 and 127 V, while the rated secondary currents have often the values of 1 A or 5 A.

When a power system is in operation with rated values of the primary quantities, the protection relay that is connected to the voltage transformers and current transformers measures the rated values of the secondary quantities.

In case of power system fault, the primary voltage usually drops and the primary current increases, often to more than 10 times the nominal current. From the relay point of view, this means that the measured secondary voltage will be lower than the usual secondary rated voltage measured from the voltage transformer and the current might increase to 10 times the nominal value, i.e., on the secondary side it will be some 10 A for a 1 A current transformer or 50 A for a 5 A current transformer.

The protection relay continuously measures the secondary quantities in all the phases, and when its protection algorithm decides that there is a power system fault, i.e., that the protected area of the power system must be disconnected, the protection relay in the majority of the cases interrupts the fault current. This is done by sending a trip command to a circuit breaker, which has the capacity of interrupting the fault current.

In a case of non directional overcurrent protection relays, the voltages are not required, and the protection algorithm is based on the measurement of the current through the current transformers. Supposing a fault current of 10 times the nominal current of the system, the protection relay that measures 10 A (or 50 A, depending on the secondary rated current of the current transformer) may decide to interrupt the fault current instantaneously or after a settable time delay. When the decision is made, a trip signal is delivered to a trip coil of the circuit breaker, which starts the separation of the poles interrupting the fault current and separating the faulty part of the power system from the healthy part.

In order to test whether the protection relay works as it should or not, a protection relay test-set is used. With reference to overcurrent protection, this test equipment delivers to the protection relay secondary currents that correspond to different power system faults, through the current generators available.

With reference to current transformers, for the current levels in the range for testing protection relays, they have the property that the secondary current is proportional at any instant to the primary current. In other words, the phasor representation of the secondary current is in phase with the primary current; the only difference is in the amplitude.

For several technical and economic reasons, power systems see more use of the so called Low Power Instrument Transformers (LPIT), also known in the past as Non Conventional Instrument Transformers (NCIT). If an LPIT is used for current measurement, it is called Low Power Current Transformer (LPCT).

Typically, all LPCTs have in common that the secondary signal is not a current, as in a current transformer, but it is a voltage.

A special type of LPCT is the Rogowski Coil. Formally, according to the standard IEC 61869-10:2017, a Rogowski Coil is denoted as a "derivative LPCT". A Rogowski coil is based on the measurement of the derivative of the primary current. As primary currents are expressed as sine or cosine waveforms, with the sine in mind, a Rogowski coil provides a voltage signal that is proportional to the value of the primary current, but it is shifted by 90 degrees. While the RMS amplitude of the secondary signal is proportional to the RMS amplitude of the primary signal, the two signals are not proportional at any time instant, because of the introduced phase shift. In order to reconstruct the primary current signal from the secondary voltage, it is necessary to integrate the voltage signal, and this task is performed by the protection relay.

Protection relays that are designed to measure the primary currents from Rogowski coils can integrate the Rogowski secondary voltage, reconstructing the waveform of the primary current, which is what the protection relay always needs to do in order to be able to protect the power system. If the derivative of the sine, (i.e., the primary current) is the cosine (the secondary Rogowski voltage), the integral of the cosine is again the sine. Apart for some proportional factors that are known to the protection relay, the primary current waveform is reconstructed from the secondary voltage signal.

A Rogowski sensor is a coil wound around a non-magnetic circuit. The advantage of this design is that the range of linearity of the measured secondary voltage in relation to the measured primary current is very high, much higher than a conventional current transformer that is affected by the saturation of the magnetic core. The same Rogowski sensor can be used to measure primary current in feeders within a very high range of nominal currents. This reduces the cost of having different current sensors for the different nominal currents of the different feeders. As example, for a feeder with 400 A primary nominal current, a current transformer 400 A/1 A would be used. For a feeder with 800 A primary nominal current, a current transformer of 800 A/1 A would be used. For both feeders, the same Rogowski sensor of 80 A/150 mV can instead be used, as the proportionality of the amplitude of the secondary voltage towards the primary current is easily kept. For 400 A, the Rogowski sensor would provide an output of 750 mV, and for 800 A the sensor wound provide an output of 1.5 V.

For testing protection relays connected to Rogowski sensors, it is today a common practice to make use of voltage generators which can generate sine waveforms of the correct amplitude and phase to reproduce the output of the Rogowski coil when the primary current is a sine waveform. It is also possible to generate a phase shift of such a voltage of the necessary 90 degrees. This is the steady state representation of the Rogowski coil output when the primary current is a sine wave at a certain fixed frequency.

This prior art solution has several problems. A first problem is that the electronics circuits used for the voltage generators are affected by a DC offset that has to be eliminated. Presence of DC offset superimposed to the AC voltage creates issues for the protection relay that integrate the total generated waveform. The integral of a constant is a ramp, and this can saturate or at least disturb the integration algorithms of the protection relay. This may create false transients that do not exist in the primary current, which is intended to be simulated by the voltage signal.

A second problem is that the amplitude of the output voltage for a Rogowski coil is dependent on the frequency, because of the derivative principle. A primary current of 80 A through a Rogowski coil of 80 A/150 mV at 50 Hz may give an output of 150 mV. The same current of 80 A, through the same sensor but at 60 Hz, would give an output of 180 mV. When that voltage signal is integrated by the protection relay, the measured voltage will always be associated to a primary current of 80 A, no matter if the frequency is 50 Hz or 60 Hz, because of the properties of the integration.

Usually, a relay test-set assumes constant proportionality between the primary current to be simulated and the secondary signal to be generated, because this is what is valid for a current transformer, without any need to consider any adjustment based on the value of the generated frequency.

To correctly simulate the output from a Rogowski coil, for a relay test-set based on the generation of a voltage signal, the basic mathematical relationship between the amplitude of the current that needs to be simulated and the amplitude of the voltage signal to be given to the relay must be changed, considering the dependency of the frequency. If 150 mV is the signal that has to be generated to simulate an 80 A current at 50 Hz, 180 mV would need to be generated if the current had a frequency of 60 Hz and 300 mV would be generated if the same current of 80 A would have a frequency of 100 Hz.

This frequency dependency has impact on testing relays where frequency deviations must be considered, which is also the case of presence of harmonics. For harmonics, if there is a primary current of 80 A at 50 Hz with superimposed 10% of second harmonic, i.e., 8 A at 100 Hz, the secondary voltage signal would be 150 mV at 50 Hz with superimposed 100 Hz waveform of 30 mV (and not of 15 mV as a constant proportional factor between primary current and secondary voltage would suggest). This means that the secondary voltage would contain 20% of $2^{nd}$ harmonics. The primary current, once the voltage has been integrated by the protection relay, will still be seen as containing 10% of $2^{nd}$ harmonics.

This frequency dependent math needs to be implemented in the test set if correct relay testing shall be done by generating a voltage signal from the test-set, when there are frequency variations or presence of harmonics.

Frequency variations are increasingly considered because of the penetration of Distributed Energy Resources (DER) in power systems.

A third problem is that relay tests with steady state voltage signals may give questionable results, even if the math related to the frequency variations is implemented. When testing protection relays connected to current transformers, there is a consensual acceptance that tests with steady state waveforms, i.e., sequences of steady state phasors, give good enough results even if they do not fully represent the behavior of the primary current signals. This test is also standardized (among others) by the IEC standard IEC 60255-1xx series of standards, and it has the name of "sequence of shots", or "ramp of shots".

The same method applied to the voltage signal that is supposed to simulate the Rogowski voltage, may give questionable results when testing protection relays, especially when testing protection relays with a very short "reaction time", which is called operate time or trip time in relay language. Also there can be issues in measuring the start time of the protection relay.

A sequence of steady state sine waveforms, where of course the phase can also change, will with high probability give a discontinuity in the voltage signal at the transition from one state, which could be a pre-fault state, i.e., load, to another state, which could be the fault condition, i.e., overcurrent.

When a protection relay integrates this discontinuity, it may encounter some difficulties and end up with a wrong reconstruction of the behavior of the primary current, which may lead to a wrong decision. Very often this wrong decision is that the relay issues the trip or start signal for a current which is sensibly lower than the expected value, causing questions in the test engineers: is the relay wrong or am I testing it in a wrong way?

SUMMARY OF INVENTION

An object of the present invention is to provide an analog accessory, a system, and a method for testing protection relays with higher reliability and accuracy than prior art solutions.

The invention is based on the insight that a Rogowski simulator generating a voltage signal representing the derivative of the primary current in the time domain, can be used when testing protection relays.

According to a first aspect of the invention, an analog accessory for use in a system for testing protection relays comprises inputs connectable to the current outputs of a test-set for protection relays and voltage outputs connectable to a protection relay to be tested, the analog accessory being characterized by an electric circuit adapted to convert current provided by the test-set into a voltage signal on the voltage outputs that simulates an output of a Rogowski sensor.

An advantage with the proposed solution is that no major re-design of test methodologies already implemented in relay test sets is required but still correct voltage signals are generated, where the frequency dependency is automatically considered and also the possible discontinuity in the voltage signal is presented to the relay in such a way, that it can be easily integrated without affecting the test results.

An analog accessory according to the invention can be made with small size. The accessory can be adapted to the already existing current range of the test set.

In a preferred embodiment, the voltage signal on the voltage outputs, during operation, simulates an output of a Rogowski sensor, including steady state and transient conditions in the time domain.

In a preferred embodiment, the electric circuit comprises a transformer having a core, a primary winding electrically connected to the inputs and a secondary winding electrically connected to the voltage outputs.

In a preferred embodiment, the core of the transformer is made of ferromagnetic material, preferably ferrite, iron, or amorphous nanocrystalline.

In a preferred embodiment, a filter is interconnected between the secondary winding of the transformer and the voltage outputs.

In a preferred embodiment, an inductor is provided together with a voltage transformer.

In a preferred embodiment, the cross sectional area of the core is below 3 $cm^2$, preferably 2.19 $cm^2$.

In a preferred embodiment, the magnetic path length of the core is below 15 cm, preferably 10 cm.

In a preferred embodiment, the number of turns in the primary winding is below 50, preferably between 20 and 40 turns, most preferably 27 turns.

In a preferred embodiment, the air gap of the transformer is less than 5 mm, preferably 2 mm.

According to a second aspect of the invention, a system for testing protection relays is provided, the system comprising: a relay test-set for protection relays provided with current outputs adapted to provide a current representing a fault condition, and a protection relay to be tested, the system being characterized by an analog accessory according to the invention, wherein the inputs of the analog accessory are connected to the current outputs of the test set and the voltage outputs of the analog accessory are connected to the protection relay to be tested, and wherein the analog accessory is provided with an electric circuit that converts the current provided by the test-set into a voltage signal that simulates an output of a Rogowski sensor.

According to a third aspect of the invention, a method of testing protection relays is provided, the method comprising the following steps: providing, by means of a relay test-set, a user settable primary current representing a fault condition, the method being characterized by the following steps: providing, by means of an analog accessory, a voltage signal representing the derivative of the primary current by simulating the behaviour of a Rogowski coil, and supplying the voltage signal to a protection relay to be tested, wherein the relay test-set is set in a mode for a Rogowski coil.

BRIEF DESCRIPTION OF DRAWINGS

The invention is now described, by way of example, with reference to the accompanying drawings, in which:

FIGS. 7*a* and 7*b* show different filter designs.

FIGS. 8*a* and 8*b* are overall model diagrams for explaining the function of the analog accessory.

DESCRIPTION OF EMBODIMENTS

In the following, a detailed description of a system, an analog accessory, and a method for testing protection relays in will be given. In this description, the terms "Rogowski sensor" and "Derivative LPCT" are used interchangeably. Although the formal standard name for this sensor is "Derivative Low Power Current Transformer" (IEC 61869-10:2017), it is commonly known as a 'Rogowski sensor' or 'Rogowski coil.'

GENERAL DESCRIPTION OF THE INVENTION

Figure 1:
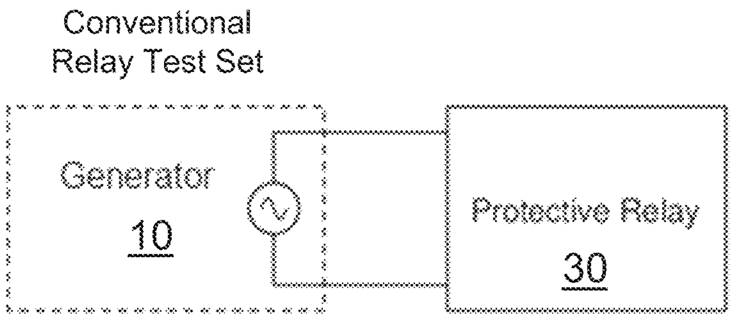
FIG. 1 is a block diagram showing a prior art protection relay test system.
Figure 2:
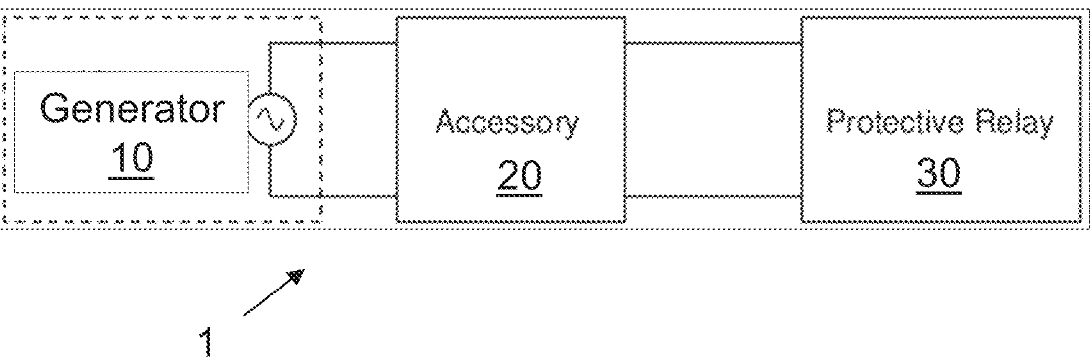
FIG. 2 is a block diagram showing the general design of a protection relay test system according to the invention.

A system for testing protection relays according to the invention, generally designated 1, is shown as a general block diagram in FIG. 2. Apart from a standard relay test-set 10, the system 1 comprises an analog accessory 20 connected to the current outputs of the relay test set 10. Although only one analog accessory 20 is shown in the figure, it will be realized that the system 1 will comprise three analog accessories, one per each phase, for testing protection relays in three-phase power systems. This means that the size of such analog accessory is a very important aspect.

The analog accessory 20 produces an output voltage or "Rogowski voltage" which is the derivative of the input current in the time domain. The linearity between the amplitude of the input current and the amplitude of the output voltage must be assured only in the current range of the test equipment.

In the analog accessory 20, the magnetic circuit is not in air as in a Rogowski coil, but it is in a ferrite or iron that allows higher values of flux density, B. The analog accessory 20 can be described as a transformer, where the maximum current that can be generated by the test-set is below the saturation flux of the magnetic circuit. This transformer is driven by the current generated by the relay test-set 10. As the reluctance of the magnetic circuit is very low and can vary very much even from the same magnetic cores, its value is controlled with an air gap, to provide a controllable repeatability among several analog accessories 20.

The secondary winding of this transformer is connected to a high impedance load, which is typically the analog input of a protection relay 30. The B flux generated by the current flowing in the primary winding is converted in voltage by the Lenz law, hence the derivative behavior of the voltage output of the analog accessory 20, in relation to the current that flows into it. The transient response of the generated voltage, i.e., the waveforms generated in case of discontinuity of the current signal and also when there is a frequency variation in the current signal are completely and automatically handled by the analog accessory 20, which is an analog simulator of a Rogowski coil.

Supposing now that the test-set has these capabilities, which is just an example. Other test sets can have different capabilities and the analog accessory 20 can be designed considering their own capabilities:

Max current = 35 A

The analog accessory 20 will in this example be designed to provide an output voltage of 100 V RMS with 35 A as input current, at 50 Hz.

The analog accessory 20 allows performing harmonic tests without the user having to calculate any frequency dependency in the values of harmonics, frequency tests, frequency ramping tests, as the conversion of the current into voltage occurs in real time, without any change in the basic procedures for phasor calculations, ramps etc. that are used with reference to the behavior of current transformers.

The analog accessory 20 is adaptable to an already existing current range of a test set 10. Such analog accessory 20 can be used by any relay test set 10, with a small correction factor, such as the 35 A/100 V, in the user interface of the test set 10. It can also be used "as is", and a test engineer could do the simple math based on proportional factors that define how much current must be injected to obtain a certain "Rogowski voltage". However, this last possibility is not convenient when the majority of the tests is performed on "Rogowski relays", but it can be accepted in cases where the test of a Rogowski relay occurs occasionally, which is still a typical case today for a relay testing engineer.

Description of the Rogowski Coil

In order to understand the design of the analog accessory 20, the function of a Rogowski coil will here be described.

A Rogowski coil is designed to be extremely linear. Therefore, the magnetic circuit of the sensor is in the air or anyway in a non-magnetic material. A Rogowski coil that has a rated primary current of 80 A (with secondary voltage output of 0.15 V for the given primary current of 80 A) is suitable to measure current in feeders with nominal current of 800 A (1.5 V output for that primary current), and after that it can be assumed a fault current of 10 times the nominal current, which will be 8000 A→15 V from the Rogowski coil.

A Rogowski coil is a wound coil on a non-magnetic material which has some properties that is in some situations useful.

- Non-intrusive, so that the former or the bobbin can be flexible material so that current measuring device can be snapped on circuit.
- Since the core is non-magnetic it cannot saturate. The dynamic range of the application current can be very large.

The obvious downside is that the amount of flux in the magnetic permeability is very low, only $4\pi 10^{-7}$ H/m. This means that induced voltage becomes very low and must be compensated with increasing the N is the turns density turns/m or the coil area $A_C$ in meters squared. The output voltage from a Rogowski coil depends on the permeability in vacuum times the rate of change of the current together with the area and turns density.

$$e = \mu_0 N A_C \frac{dI}{dt}$$

In a system with a Rogowski coil used for current measurement the protection relay needs dedicated Rogowski Inputs. Since the measured quantity is the rate of change of the primary current the protection relay has to integrate the Rogowski measured voltage e(t).

Description of an Embodiment of the Analog Accessory

It is described below how the system, the analog accessory, and the method according to the invention simulate a Rogowski coil for testing protection relays connected to Rogowski sensors, i.e., Derivative LPCTs.

Figures 3, 4:
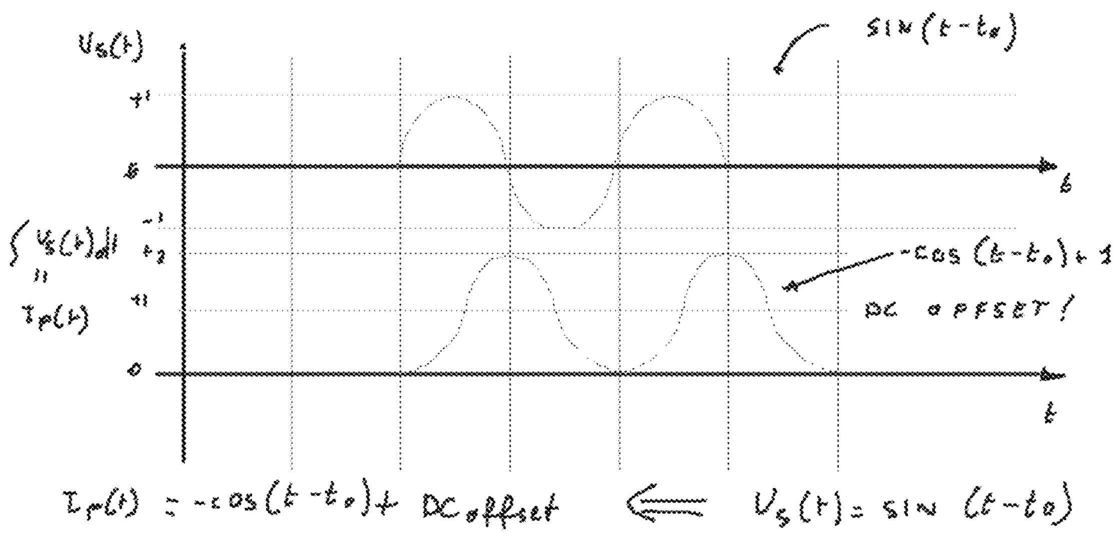
FIG. 3 is a diagram showing voltages in a Rogowski coil.
FIG. 4 is a block diagram showing an analog accessory according to the invention for use in the system of FIG. 2.

An analog accessory can be designed to function either with a voltage generator or a current generator, see the block diagram of FIG. 4. In the preferred embodiment the design refers to a current source.

Starting with the equation from the Rogowski Coil the output voltage e is dependent of the rate of change of the current as input.

$$e = \mu_0 N A \frac{dI}{dt}$$

The similarity of the Rogowski equation with that of a voltage over an inductor when driven by a current source is obvious.

$$v = -L_{M,ext} \frac{dI}{dt}$$

Shown in FIG. 8*a*, If one would use an inductor as analog device, to get 100V at 50 Hz/35 A the inductance needed would equal $$L_{M,ext} = \frac{100\text{ V}}{2\pi 50\text{ Hz } 35} = 9\text{ mH}$$

The analog input of the protection relay 30 can be considered high impedance, ZIN shown in FIG. 8*a*. To be able to use a lower value inductor, to reduce the amount of stored energy a voltage transformer where $N_S > N_P$ can be used to scale the output voltage by the turns ratio.

That is shown in FIG. 8*b*. A transformer can be modeled as an ideal transformer with parasitic circuit elements and a turns ratio $$\frac{N_S}{N_P}.$$

At low frequencies, typically below 1 kHz, only the magnetizing inductance needs to be considered. This inductance arises due to the fact that no perfect magnetic material exists, and there is always a finite permeability. This parasitic inductor $L_M$ will be effectively in parallel to $L_{M,ext}$. This leads to the conclusion that one either use an external inductor, but then $L_M >> L_{M,ext}$ or removing $L_{M,ext}$ and let the magnetizing element $L_M$ be the derivative circuit element. The magnetizing inductance is controlled by introducing an air gap in the magnetic core.

Considering the second case, where the inductor is internal to the transformer the output voltage is then $$V_{OUT} = L_{MAG} \frac{dI}{dt} \frac{N_s}{N_P}$$

An embodiment of an analog accessory 20 is schematically shown in FIG. 4. The analog accessory 20 essentially comprises a transformer 22 with a controlled magnetizing inductance. A practical transformer design would optionally add a filter with low-pass characteristics 24 to reduce potential frequencies that are not of interest. The filter corner frequency needs to be positioned far above and below the frequencies of interest to not interfere with desired functionality of the accessory. However there does not seem to be any restrictions on design, i.e., it can be made with active or passive components. In the preferred embodiment it is designed with passive components, only resistors and capacitors due to the high input impedance of the protective relay.

As an example of embodiment, consider a common Rogowski current sensor for used in power systems has the ratio of 0.15V/80 A=1.9 mV/A at 50 Hz. To simulate that particular current sensor ratio of 1.9 mV/A with fault currents up to 16 kA, close to 30V is needed at the input of the relay. Using a test set generator current generator capable of output of 35 A at 50 Hz, in a embodiment as in FIG. 2 the product $$\frac{N_s}{N_p} \cdot L_{MAG}$$

equals:

$$\frac{N_s}{N_p} \cdot L_{MAG} = \frac{V_{OUT,RMS}}{2\pi \cdot f \cdot I_{RMS}} = 0.0027 \text{ H}$$

Achieving this product will be a trade-off transformer size and weight, transfer function accuracy and power losses. These choices will increase or decrease $L_{MAG}$ and the turns ratio $$\frac{N_s}{N_p}$$

are then used to compensate to achieve the desired output voltage. That is, within reason, the coil former has a limited volume to fit copper wire and will pose as the upper limit to the number of secondary turns available for a certain wire cross-sectional area.

Sizing the transformer in FIG. 4 with internal magnetizing inductor is preferably done using the equation for inductances $$L_{MAG} = \frac{\mu_0 N_p^2 A_c}{l_g + l_c/\mu_{rc}}$$

and using the equation for maximum flux density $$B_{pk,max} = \frac{\mu_0 N_p I_{peak}}{l_g + \frac{l_c}{\mu_{rc}}}$$

Where permeability of free space $\mu_0 = 4\pi 10^{-7}$ H/m, $N_P$ primary turns and $A_C$ is the cross-sectional area of the core, $I_g$ is the air gap, $I_c$ is the magnetic path length of the chosen core, $I_{peak}$ is the peak primary current and $\mu_{rc}$ is the relative permeability of the magnetic core. And $B_{pk,max}$ is the maximum flux density for design, ultimately $B_{pk,max} < B_s$, where $B_s$ is the maximum flux density or the magnetic material will saturate.

Under the assumption that $\mu_{rc} >> l_c$ can for a chosen material maximum flux density $B_{pk,max}$, a wanted size of cross sectional area of the core $A_C$, maximum peak current $I_{peak}$ and wanted number of primary turns get a maximum value of the magnetizing inductance of the two equations combined $$L_{MAG} = \frac{\mu_0 N_p^2 A_c}{l_g} = \frac{N_P A_c B_{pk,max}}{I_{p,max}}$$

Under the same assumption as before, the air gap can be estimated to $$l_g = \frac{N_P \mu_0 I_{p,max}}{B_{pk,max}}$$

As an example, assume an iron lamination core but calculation method is valid for other core materials as well: with $A_c = 4.8$ cm$^2$ and the iron core has assumed $B_s \approx 1.0$ T. A design margin set to 0.2 T so $B_{pk,max} = 0.8$ T and $N_p = 20$ for keeping the power losses due to resistance in the copper wire in the primary winding low. Then $L_{MAG} = 155$ µH and $l_g = 1.6$ mm. And finally, to compensate for the $L_{MAG}$ and $N_p$ then the number of secondary turns need to be chosen such that the output voltage is around 30V then $N_s$ equals 349.

The use of the preferred embodiment provides the following advantages:

- Closely resembles the response of a Rogowski coil, even at high frequencies.
- Solution is isolated, grounding scheme of relay is of less importance.
- Solution is isolated, no DC or LF offset that can drive integrator in saturation.
- Requirement on Compliance voltage on current generator is made trivial.
- Magnetizing inductance can be made to have small inductance, eases driving for the current generator.

An example of a test sequence implementing the method according to the invention will now be given:

- Step 1 (pre-fault): Simulation of primary 1000 A @ 0 deg @ 50 Hz for 5 seconds to simulate a full load condition
- Step 2 (fault). Simulation of primary 10 000 A @-80 deg @ 50 Hz for 500 ms to simulate a fault.

The Rogowski ratio to be considered is 80 A/150 mV @ 50 Hz.

Figure 5:
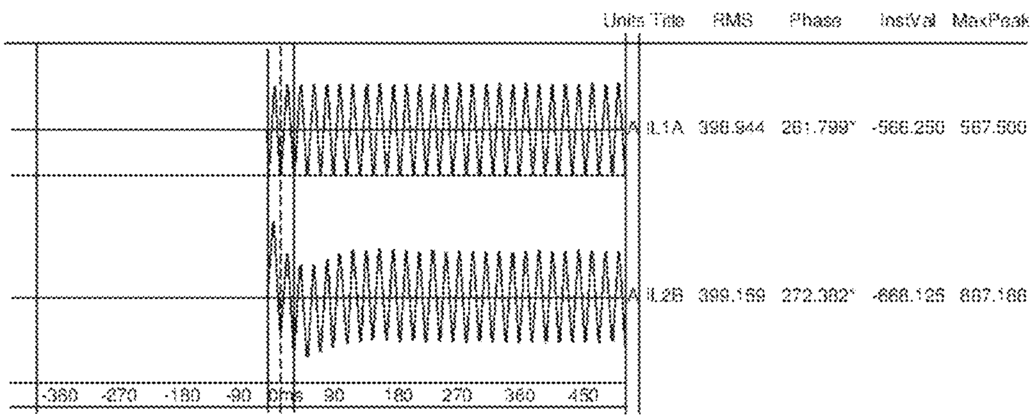
FIG. 5 shows waveforms detected by the protection relay according to the invention and prior art.

The test set, through the analog accessory 20, would need to generate the following sequence of a voltage signal in the steady state domain to the protection relay 30:

- Voltage of 1,875 V @ 90 deg @ 50 Hz for 5 s and then
- Voltage of 18.75 V @+10 deg @ 50 Hz for 500 ms The analog accessory 20 should also provide the correct transient behavior for the discontinuity in the current in its transition from pre-fault to fault. FIG. 5 shows in the lower curve the wrong transients detected by the protection relay when integrating a simple discontinuous voltage signal. In the upper curve, it also shows how the protection relay reconstructs the same discontinuity when the voltage signal is proposed to the signal through the analog accessory according to the invention.

For example, If the analog accessory 20 has a ratio of 35 A/100 V, this can be written as 350 mA/V. The current that must be injected into the analog accessory 20 to get the necessary 1.875 V and 18.75 V shall be:

$$\text{l\_injection\_pre-fault} = 350 \text{ mA/V} * 1.875 \text{ V} = 656.25 \text{ mA}$$

$$\text{l\_injection\_fault} = 350 \text{ mA/V} * 18.75 = 6562.5 \text{ mA} = 6.562 \text{ A}$$

The test set 10 will therefore inject into the analog accessory 20:

- A current of 656.25 mA @ 0 deg @ 50 Hz for 5 s, and then
- A current of 6.562 A @-80 deg @ 50 Hz for 500 ms The frequency dependency of the voltage signal will also occur automatically together with the correct transient behavior with current discontinuity, allowing an easy integration to the protection relay. If the user changes the frequency to 60 Hz for example, the test set 10 will still inject the same quantities:

- Current of 656.25 mA @ 0 deg @ 60 Hz for 5 s, and then
- Current of 6.562 A @-80 deg @ 60 Hz for 500 ms However, this time the analog accessory 20 will automatically provide a voltage output that is 20% higher than the 50 Hz voltage output (60 Hz is 20% higher than 50 Hz):

- Voltage of 2.25 V @ 90 deg @ 60 Hz for 5 s, and then

Voltage of 22.50 V @+10 deg @ 60 Hz for 500 ms

The above examples have shown that there is no need to change anything in the way the test is set-up from the user, neither in what the test set generates, because actually the test set will generate a current proportional to the desired primary current into the analog accessory, and the analog accessory 20 will provide a voltage output very similar to what would be produced by a Rogowski coil, without being a Rogowski coil.

When testing relays connected to current transformers, it is always valid that the current transformer ratio is not dependent on the power system frequency.

By keeping the same example as above, the user may ask the test set to inject a sequence, such as a sequence of steps or steady state shots. For example, considering the relay test set settable in primary values:

Step 1 (pre-fault): Simulation of 1000 A @ 0 deg @ 50 Hz for 5 seconds to simulate a full load condition.

Step 2 (fault): Simulation of 1000 A @ 0 deg @ 50 Hz+200 A @ 0 deg @100 Hz for 500 ms to simulate the presence of 20% of second harmonics on the fundamental frequency.

For a relay connected to a current transformer, and with a current transformer ratio of for example 1000 A/1 A, the test set will then perform this sequence:

Current of 1 A @ 0 deg @ 50 Hz for 5 s, and then

Current of 1 A @ 0 deg @ 50 Hz+0.2 A @ 0 deg @ 100 Hz for 500 ms

Considering now the relay connected to a Rogowski coil with ratio 80 A/150 mV @ 50 Hz. The test set, through the analog accessory, will generate:

Voltage of 1.875 V @ 90 deg @ 50 Hz for 5 s and then

Voltage of 1.875 V @ 90 deg @ 50 Hz+0.75 V @ 90 deg @ 100 Hz for 500 ms

Note that the 100 Hz signal is 40% of the 50 Hz signal (0.75 V/1.875 V=0.4=40%) but the user has requested the test set 20% and the test set has generated 20% of harmonics into the analog solution. Of course, the correct voltage transient will be generated by the analog solution at the pre-fault to fault transition, facilitating the integration of the voltage signal to the relay.

Figure 6:
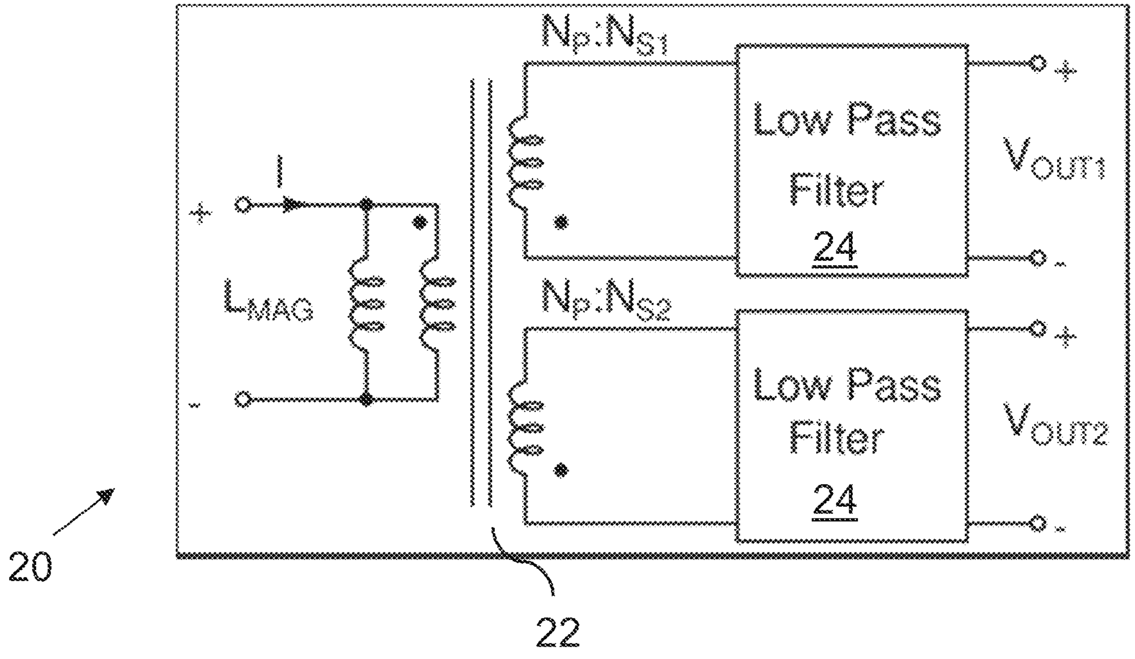
FIG. 6 shows an alternative embodiment of an analog accessory according to the invention.

In an alternative embodiment of the analog accessory 20, shown in FIG. 6 two independent secondary windings are provided in order to achieve better accuracy if needed for testing Rogowski coil at lower current values, in the range of 0 . . . 20 V, for example. The second winding could then give an amplitude of 20 V with 35 A as input. It will be realized that more than two secondary windings, such as three or four, could also be provided.

Preferred embodiments of a system, an analog accessory, and a method for testing protection relays have been described. It will be appreciated that these may be varied within the scope of the appended claims without departing from the inventive idea.

All circuits that can be considered to have high pass characteristics which have first order behavior in the frequency of interest will show a similar behavior to the preferred embodiment. For example, using a voltage generator a resistive-capacitive, see FIG. 7*a*, or resistive-inductive, see FIG. 7*b*, first order filters can be designed to function similarly to the preferred embodiment.

In case the corner frequency $f_A=1/(2\pi\cdot R\cdot C)$, see FIG. 7*a*, or the case for FIG. 7*b*, $f_B=R/(2\pi\cdot L)$ is much larger than highest frequency of interest, roughly 10 times larger or more the slope of the magnitude on log-log plot (Bode plot) will show an positive +20 dB/decade and can be considered to have a derivative behavior. To ease requirements on generator compliance voltage, the circuits can be used with an optional voltage transformer, as depicted in the FIGS. 7*a* and 7*b*.

What is claimed is:

1. An analog accessory for use in a system for testing protection relays, comprising:

inputs connectable to current outputs of a test-set for protection relays voltage outputs connectable to a protection relay to be tested, and an electric circuit adapted to convert current provided by the test-set into a voltage signal on the voltage outputs that simulates an output of a Rogowski sensor wherein the electric circuit comprises a transformer having a core, a primary winding electrically connected to the inputs and a secondary winding electrically connected to the voltage outputs.

2. The analog accessory according to claim 1, wherein the voltage signal on the voltage outputs, during operation, simulates an output of a Rogowski sensor, including steady state and transient conditions in the time domain.

3. The analog accessory according to claim 1, wherein the core of the transformer is made of ferromagnetic material.

4. The analog accessory according to claim 3, wherein the core of the transformer is made of ferrite, iron, or amorphous nanocrystalline.

5. The analog accessory according to claim 1, comprising a filter interconnected between the secondary winding of the transformer and the voltage outputs.

6. The analog accessory according to claim 1, comprising an inductor together with a voltage transformer.

7. The analog accessory according to claim 1, wherein the cross sectional area of the core is below 3 $cm^2$.

8. The analog accessory according to claim 7, wherein the cross sectional area of the core is 2.19 $cm^2$.

9. The analog accessory according to claim 1, wherein the magnetic path length of the core is below 15 cm.

10. The analog accessory according to claim 9, wherein the magnetic path length of the core is 10 cm.

11. The analog accessory according to claim 1, wherein the number of turns in the primary winding is below 50.

12. The analog accessory according to claim 11, wherein the number of turns in the primary winding is between 20 and 40 turns.

13. The analog accessory according to claim 12, wherein the number of turns in the primary winding is 27 turns.

14. The analog accessory according to claim 1, wherein the air gap of the transformer is less than 5 mm.

15. The analog accessory according to claim 14, wherein the air gap of the transformer is 2 mm.

16. A system for testing protection relays, the system comprising:

a relay test-set for protection relays provided with current outputs adapted to provide a current representing a fault condition, a protection relay to be tested, and an analog accessory according to claim 1, wherein the inputs of the analog accessory are connected to the current outputs of the test set and the voltage outputs of the analog accessory are connected to the protection relay to be tested, and wherein the analog accessory is provided with an electric circuit that converts the current provided by the test-set into a voltage signal that simulates an output of a Rogowski sensor wherein the electric circuit comprises a transformer having a core, a primary winding electrically connected to the inputs and a secondary winding electrically connected to the voltage outputs.

17. A method of testing protection relays, the method comprising the following steps:

providing, by means of a relay test-set, a user settable primary current representing a fault condition, providing, by means of an analog accessory, a voltage signal representing the derivative of the primary current by simulating the behaviour of a Rogowski coil, and supplying the voltage signal to a protection relay to be tested, wherein the relay test-set is set in a mode for a Rogowski coil;

wherein the electric circuit comprises a transformer having a core, a primary winding electrically connected to the inputs and a secondary winding electrically connected to the voltage outputs.

* * * * *